(12) United States Patent
Riera et al.

(10) Patent No.: US 12,183,692 B1
(45) Date of Patent: Dec. 31, 2024

(54) EMBEDDED INDUCTORS AND INTEGRATED VOLTAGE REGULATORS FOR PACKAGED SEMICONDUCTOR DEVICES

(71) Applicant: Saras Micro Devices, Inc., Chandler, AZ (US)

(72) Inventors: Carlos Riera, Atlanta, GA (US); Bartlet H. DeProspo, Chandler, AZ (US); Urmi Ray, San Diego, CA (US)

(73) Assignee: SARAS MICRO DEVICES, INC., Chandler, AZ (US)

( * ) Notice: Subject to any disclaimer, the term of this patent is extended or adjusted under 35 U.S.C. 154(b) by 0 days.

(21) Appl. No.: 18/404,535

(22) Filed: Jan. 4, 2024

(51) Int. Cl.
*H01L 23/64* (2006.01)
*H01L 21/48* (2006.01)
*H01L 23/538* (2006.01)

(52) U.S. Cl.
CPC ........ *H01L 23/645* (2013.01); *H01L 21/4857* (2013.01); *H01L 21/486* (2013.01); *H01L 23/5383* (2013.01); *H01L 23/5384* (2013.01); *H01L 23/642* (2013.01)

(58) Field of Classification Search
CPC .............. H01L 23/645; H01L 23/5383; H01L 23/5384; H01L 23/642; H01L 21/4857; H01L 21/486
See application file for complete search history.

(56) References Cited

U.S. PATENT DOCUMENTS

| | | | | |
|---|---|---|---|---|
| 8,058,960 | B2 * | 11/2011 | Hebert | H01L 23/645 |
| | | | | 336/200 |
| 10,643,994 | B2 * | 5/2020 | Xu | H01L 24/09 |
| 2005/0013092 | A1 | 1/2005 | Yuan et al. | |
| 2007/0257761 | A1 * | 11/2007 | Mano | H01F 17/06 |
| | | | | 336/200 |
| 2013/0070392 | A1 | 3/2013 | Merker et al. | |
| 2016/0163443 | A1 * | 6/2016 | Erturk | H01F 41/14 |
| | | | | 336/200 |
| 2018/0151297 | A1 | 5/2018 | Hattori et al. | |
| 2020/0008302 | A1 * | 1/2020 | Jain | H05K 1/183 |
| 2021/0099149 | A1 * | 4/2021 | Lan | H03H 7/1741 |
| 2021/0100104 | A1 * | 4/2021 | Sung | H01F 17/0013 |
| 2021/0143787 | A1 * | 5/2021 | Shirasaki | H03H 7/0115 |
| 2023/0096368 | A1 * | 3/2023 | Aleksov | H01L 23/49822 |
| | | | | 257/531 |
| 2023/0111374 | A1 * | 4/2023 | Kano | H01L 28/40 |
| | | | | 257/531 |
| 2023/0317642 | A1 * | 10/2023 | Ahmed | H01L 23/49827 |
| | | | | 257/31 |
| 2024/0114623 | A1 * | 4/2024 | Darmawikarta | H05K 1/186 |

* cited by examiner

Primary Examiner — Dao H Nguyen
(74) Attorney, Agent, or Firm — Stetina Brunda Garred & Brucker

(57) ABSTRACT

A package substrate for a semiconductor device includes a first substrate core and an inductor embedded in the first substrate core, the inductor including a magnetic core embedded in the first substrate core and a conductive winding surrounding the magnetic core, the conductive winding including one or more first segments defined by metal patterning on the first substrate core and one or more second segments defined by one or more conductive vias extending through the first substrate core. The package substrate may further include a capacitor embedded in the first substrate core and/or in a second substrate core vertically stacked with the first substrate core.

20 Claims, 7 Drawing Sheets

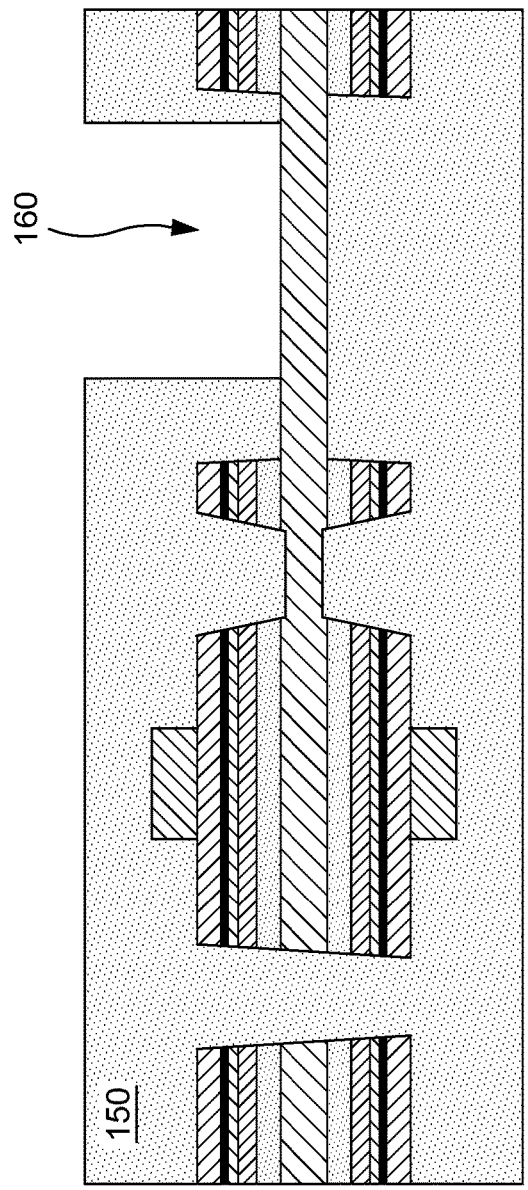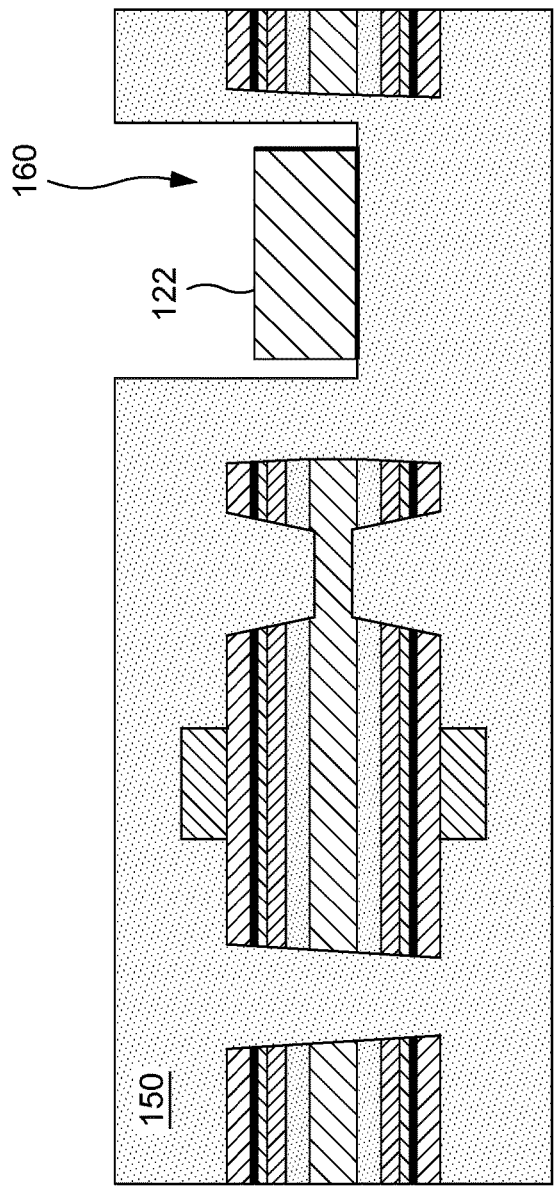

EMBEDDED INDUCTORS AND INTEGRATED VOLTAGE REGULATORS FOR PACKAGED SEMICONDUCTOR DEVICES

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present disclosure generally relates to integrated circuits (ICs) and, more particularly, to package substrates for semiconductor devices containing passive components embedded in a substrate core thereof.

Performance of ICs, and in particular power delivery and voltage regulation, is constrained by available layouts requiring connection to external devices. For example, the distance from the load and interconnect parasitics associated with conventional inductor placements limits the performance of modern applications including high performance computing (e.g., data centers, artificial intelligence and deep learning, mobile computing platforms, GPUs, FPGA logic), analog and RF power and filter architectures, and electric vehicle power architectures.

BRIEF SUMMARY

The present disclosure contemplates various devices and methods for overcoming the above drawbacks accompanying the related art. One aspect of the embodiments of the present disclosure is a package substrate for a semiconductor device. The package substrate may comprise a first substrate core and an inductor embedded in the first substrate core. The inductor may include a magnetic core embedded in the first substrate core and a conductive winding surrounding the magnetic core. The conductive winding may include one or more first segments defined by metal patterning on the first substrate core and one or more second segments defined by one or more conductive vias extending through the first substrate core.

The package substrate may comprise a capacitor embedded in the first substrate core. The inductor and the capacitor may define a voltage regulator arranged to step down a voltage output by an integrated circuit to be mounted on the package substrate. The voltage regulator may comprise a buck converter.

The package substrate may comprise a second substrate core vertically stacked with the first substrate core and a capacitor embedded in the second substrate core in vertical alignment with the inductor embedded in the first substrate core. The inductor and the capacitor may define a voltage regulator arranged to step down a voltage output by an integrated circuit to be mounted on the package substrate. The voltage regulator may comprise a buck converter.

The package substrate may comprise a second substrate core vertically stacked with the first substrate core and a capacitor embedded in the second substrate core in vertical alignment with a redistribution layer (RDL) of the first substrate core.

The package substrate may comprise a second substrate core vertically stacked with the first substrate core, wherein a redistribution layer (RDL) of the second substrate core is in vertical alignment with the inductor embedded in the first substrate core.

Another aspect of the embodiments of the present disclosure is a method of manufacturing a package substrate for a semiconductor device. The method may comprise providing a first capacitor including a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer. The method may further comprise exposing a portion of the conductive substrate, filling the exposed portion of the conductive substrate with insulating material, removing a portion of the insulating material to re-expose a portion of the conductive substrate, removing the re-exposed portion of the conductive substrate to produce a cavity surrounded by the insulating material, providing a magnetic core within the cavity, filling the cavity with insulating material, and forming a conductive winding surrounding the magnetic core to define a first inductor.

The conductive winding may include one or more first segments defined by metal patterning outside the insulating material and one or more second segments defined by one or more conductive vias extending through the insulating material. The metal patterning may define a pair of inductor terminals electrically connected to the conductive winding. The metal patterning may define a first electrode terminal electrically connected to the conductive substrate and a second electrode terminal electrically connected to the front and back conductive polymer layers.

The method may comprise vertically stacking a first substrate core including the first capacitor and the first inductor with a second substrate core such that a second capacitor embedded in the second substrate core is in vertical alignment with the first inductor embedded in the first substrate core.

The method may comprise vertically stacking a first substrate core including the first capacitor and the first inductor with a second substrate core such that a second capacitor embedded in the second substrate core is in vertical alignment with a redistribution layer (RDL) of the first substrate core.

The method may comprise vertically stacking a first substrate core including the first capacitor and the first inductor with a second substrate core such that a redistribution layer (RDL) of the second substrate core is in vertical alignment with the first inductor embedded in the first substrate core.

Another aspect of the embodiments of the present disclosure is a package substrate for a semiconductor device. The package substrate may comprise a first substrate core and a capacitor embedded in the first substrate core, the capacitor including a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer. The package substrate may further comprise an inductor embedded in the first substrate core.

The package substrate may comprise a second substrate core vertically stacked with the first substrate core and a capacitor embedded in the second substrate core in vertical alignment with the inductor embedded in the first substrate core.

The package substrate may comprise a second substrate core vertically stacked with the first substrate core and a capacitor embedded in the second substrate core in vertical alignment with a redistribution layer (RDL) of the first substrate core.

The package substrate may comprise a second substrate core vertically stacked with the first substrate core, wherein a redistribution layer (RDL) of the second substrate core is in vertical alignment with the inductor embedded in the first substrate core.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 4 is a cross-sectional view of another processing stage in manufacturing the package substrate;

FIG. 5 is a cross-sectional view of another processing stage in manufacturing the package substrate;

DETAILED DESCRIPTION

The present disclosure encompasses various embodiments of embedded components in a package substrate of a semiconductor device, along with methods of manufacture thereof. The detailed description set forth below in connection with the appended drawings is intended as a description of several currently contemplated embodiments and is not intended to represent the only form in which the disclosed subject matter may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
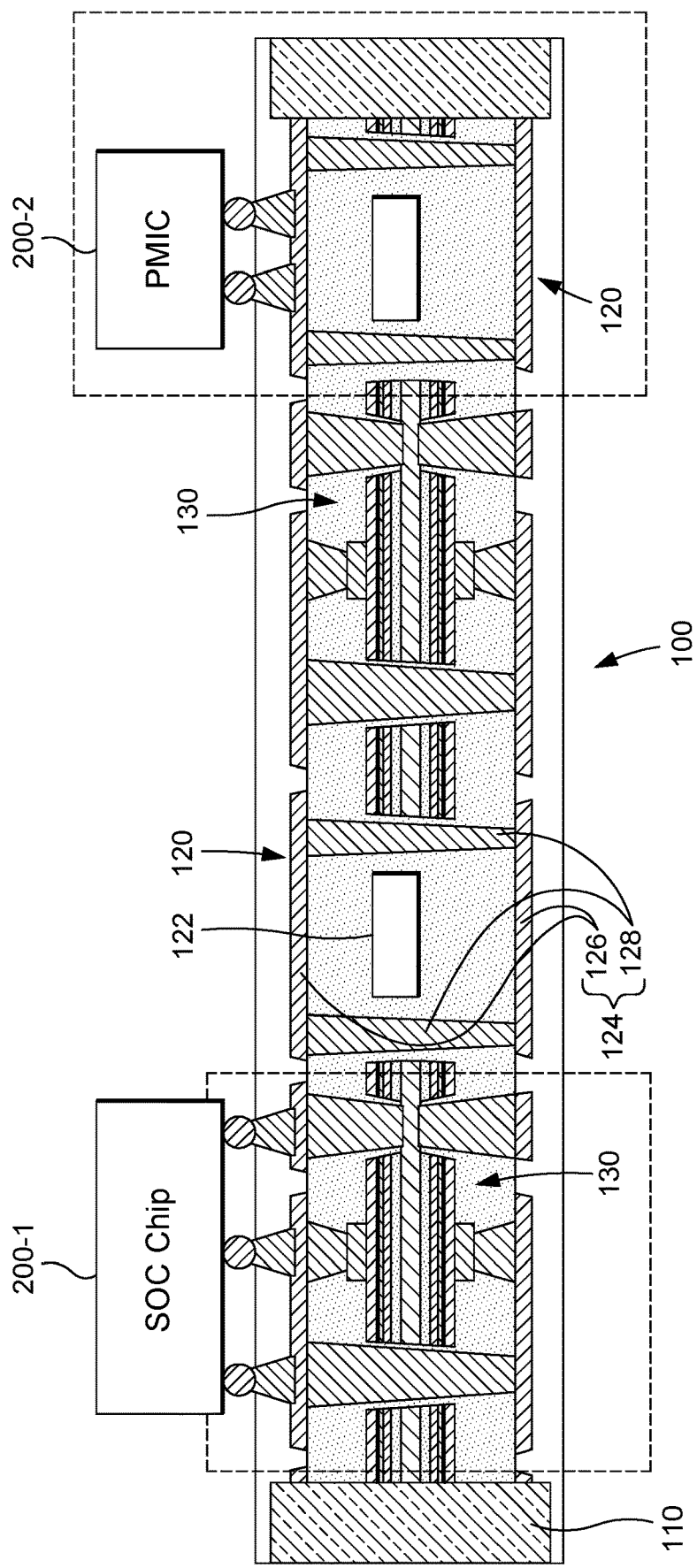
FIG. 1 is a cross-sectional view of a package substrate for a semiconductor device, together with two such semiconductor devices mounted thereon.

FIG. 1 is a cross-sectional view of a package substrate 100 for an integrated circuit (IC) 200, together with two such ICs 200-1, 200-2 (collectively ICs 200) mounted thereon. Advantageously, the package substrate 100 may include one or more inductors 120 embedded in a substrate core 110 thereof. Together with one or more capacitors 130, the package substrate 100 may define a voltage regulator arranged to step down a voltage output from an IC 200 to be mounted thereon. Such an integrated voltage regulator (IVR), which may comprise a buck converter (in some cases in combination with a portion of a PMIC 200-2 and/or the substrate core 110), for example, may eliminate the conventional need to provide a separately packaged buck converter or other voltage regulator, thus allowing the integration of the IVR nearer to the load and minimizing interconnect parasitics accordingly.

As shown in FIG. 1, the inductor 120 may include a magnetic core 122 embedded in the substrate core 110 and a conductive winding 124 surrounding the magnetic core 122. The magnetic core 122 may be under 200 microns thick (in the vertical direction in FIG. 1), for example, or may in some cases be thicker (e.g., 300-350 microns) depending on the thickness of the substrate core 110 (which may vary depending on the particular application). In general, in order to achieve a desired volumetric inductance density (nH/mm$^3$) for a given substrate core thickness (e.g., 1.2 mm), the magnetic core 122 may be sized as desired in the lateral x and y dimensions while maintaining a small enough thickness (z dimension) for embedding within the substrate core 110. The conductive winding 124 may include one or more first segments 126 defined by metal patterning on the substrate core 110 and one or more second segments 128 defined by one or more conductive vias extending through the substrate core 110. As such, the conductive winding 124 of the inductor 120 may additionally serve as a passthrough electrical connection as may be needed depending on the particular application, making it unnecessary to introduce additional passthrough connections that would take up extra space. In a case where the same substrate core 110 also includes one or more embedded capacitors 130, the inductor(s) 120 may be arranged laterally adjacent to the capacitors 130, i.e., in a side-by-side relationship within the same plane defined by the substrate core 110. Such inductors 120 and capacitors 130 may be arranged in series or in parallel or completely isolated from each other as needed for the particular application by implementation of appropriate metal patterning on either or both sides of the substrate core 110.

Figure 2:
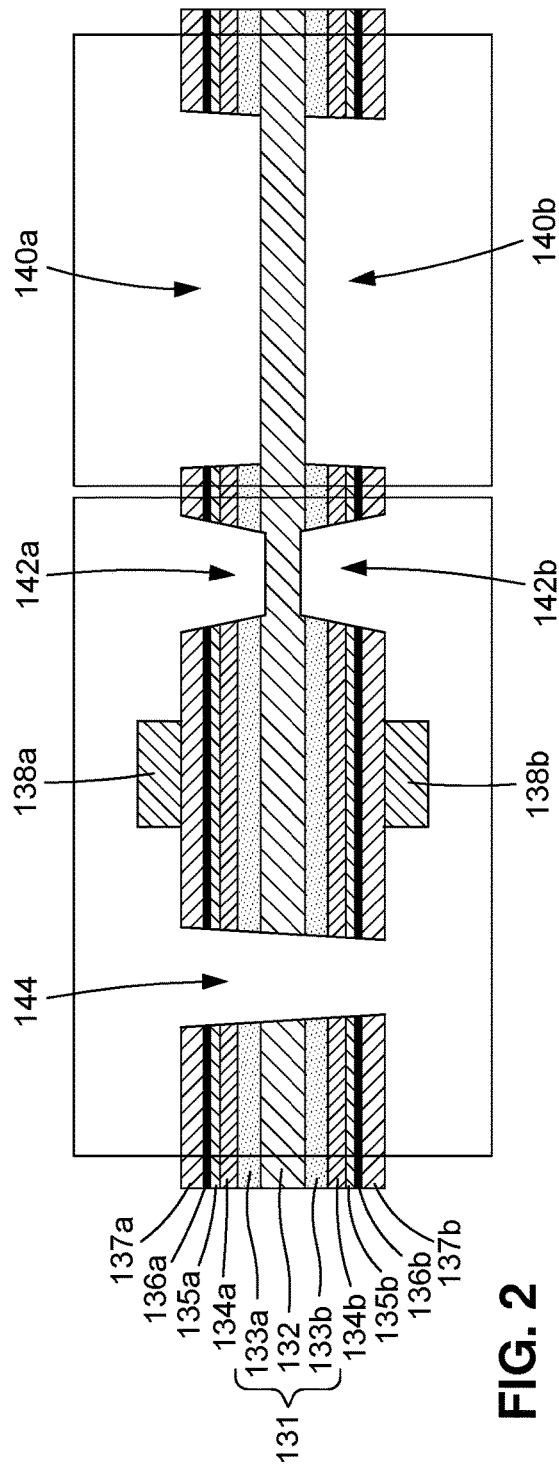
FIG. 2 is a cross-sectional view of a processing stage in manufacturing the package substrate.

FIGS. 2-7 are cross-sectional views of processing stages in manufacturing the package substrate 100 shown in FIG. 1. As relates to the embedding of the inductor(s) 120 described herein, the process may begin with forming cavities for the inductor(s) 120 and for any vias associated with the capacitor(s) 130 and/or additional passthrough vias, e.g., by via lasing. Prior to this step, a series of layers may be built up on the conductive substrate of the substrate core 110 to embed capacitive elements therein. For example, as indicated in FIG. 2, each capacitor 130 (left side of FIG. 2) may comprise a conductive substrate 131 serving as a first electrode (e.g., anode) that is made of aluminum, an aluminum alloy, or another material (e.g., tantalum) that is etched or otherwise modified to have a high surface area, such as an etched aluminum foil as described in Applicant's own U.S. Patent Application Pub. No. 2023/0067888 ("the '888 publication"), entitled "Planar High-Density Aluminum Capacitors for Stacking and Embedding," the entire contents of each of which is incorporated by reference herein. Alternative or additional modifications to increase the surface area of the conductive substrate 131 may include deposition of a sintered aluminum powder or other aluminum, aluminum oxide, titanium, or titanium oxide powder thereon. The conductive substrate 131 may be a metal foil as described in Applicant's own U.S. Patent Application Pub. No. 2023/0073898, entitled "Modified Metal Foil Capacitors and Methods for Making Same," the entire contents of which is incorporated by reference herein. As illustrated, the conductive substrate 131 may thus comprise a solid metal portion 132 and a high surface area (HSA) portion 133a, 133b respectively on front and back sides thereof.

The HSA portion 133a, 133b of the conductive substrate 131 may include, conformal therewith, a respective front and back dielectric layer 134a, 134b such as a naturally occurring oxide layer (e.g., an aluminum oxide layer) or one that has been grown by an anodization process (e.g., by placing the conductive substrate 131 in an electrolytic solution and passing a current through the solution), grown by thermal oxidation in a humidity chamber, or coated on the conductive substrate 131 (e.g., by atomic layer deposition). As may be appreciated, the dielectric layer 134a, 134b may, in general, exhibit the same high surface area as the underlying HSA portion 133a, 133b of the conductive substrate 131 as it fills in and takes the shape of the various tunnels and recesses that may result from the etching or other modification to the material of the conductive substrate 131. The HSA portion 133a, 133b of the conductive substrate 131 may further include, conformal therewith, a respective front and back conductive polymer layer 135a, 135b that is electrically isolated from the conductive substrate 131 by the dielectric layer 134a, 134b and may exhibit the same high surface area as the underlying conductive substrate 131 as it fills in and takes the shape of the various tunnels and recesses that may result from the etching or other modification to the material of the conductive substrate 131, with the dielectric layer 134a, 134b sandwiched therebetween. The conductive polymer layer 135a, 135b may serve as a second electrode (e.g., cathode) of the capacitor 130. A variety of conductive polymers may be suitable for use as the conductive polymer layer 135a, 135b serving as the second electrode of the capacitor 130 described herein. The conductive polymer layer may, for example, comprise one or more of a polypyrrole, a polythiophene, a polyaniline, a polyacetylene, a polyphenylene, a poly(p-phenylene-vinylene), PEDOT: PSS (poly(3,4-ethylenedioxythiophene) polystyrene sulfonate), or P3HT (poly(3-hexylthiophene-2,5-diyl)). In some cases, TiN or Pt may be used in place of the conductive polymer.

In addition to the dielectric layer 134a, 134b and the conductive polymer layer 135a, 135b serving as the second electrode (e.g., cathode), the capacitor 130 may include additional layers on the conductive polymer layer 135a, 135b in order to improve the electrical connection between the conductive polymer layer 135a, 135b and the metal terminals of the package substrate 100 (described below). For example, a front and back carbonaceous layer 136a, 136b (e.g., a carbon ink) and/or a front and back metallization layer 137a, 137b (e.g., Ag or Ti/Cu) may be applied on the conductive polymer layer 135a, 135b. The carbonaceous layer 136a, 136b may be applied in direct, physical contact with the respective conductive polymer layer 135a, 135b, and the metallization layer 137a, 137b may be applied on the conductive polymer layer 135a, 135b by being in direct, physical contact with the respective carbonaceous layer 136a, 136b thereon. Preferably, the application of the metallization layer 137a, 137b may comprise depositing a diffusion barrier on the conductive polymer layer 135a, 135b (e.g., directly in contact with the carbonaceous layer 136a 136b thereon) and depositing metal adjacent the diffusion barrier. The carbonaceous layer 136a, 136b, if included, may advantageously reduce a contact resistance between the conductive polymer layer 135a, 135b and other components, such as a diffusion barrier layer of the metallization layer 137a, 137b. The carbonaceous layer 136a, 136b may include, for example, carbon black, graphite, a carbon-based ink, or a polymeric, and may be applied using a variety of techniques, such as screen printing, inkjet printing, sputter deposition, vacuum deposition, spin coating, doctor blading, or the like. The metallization layer 137a, 137b may be used to provide high-quality electrical conductivity between the respective conductive polymer layer 135a, 135b (acting as the second electrode of the capacitor 130) and the metal terminals of the package substrate 100 for electrical connection of the capacitor 110 with an external circuit. The metallization layer 137a, 137b may include a metal such as Ag, Au, Cu, Pt, Pd, and/or composites or alloys of the aforementioned metals, or in some cases polymers such as epoxies, silicones, or fluoroelastomers. Including a diffusion barrier layer in the metallization layer 137a, 137b may limit infiltration of components from the metallization layer 137a, 137b into the carbonaceous layer 136a, 136b or conductive polymer layer 135a, 135b. Example materials for a diffusion barrier layer include, but are not limited to, Ti, W, Cr, Ti—W, TaN, and/or Co—W. The metallization layer 137a, 137b, as well as any diffusion barrier layer thereof, may be applied using any suitable techniques, such as vacuum deposition (e.g., sputter deposition). Conductive pads 138a, 138b may be formed (e.g., by landing pad printing) respectively on the metallization layers 137a, 137b for subsequent connection of the second electrode (e.g., cathode) to the metal terminals of the package substrate 100.

Figure 3:
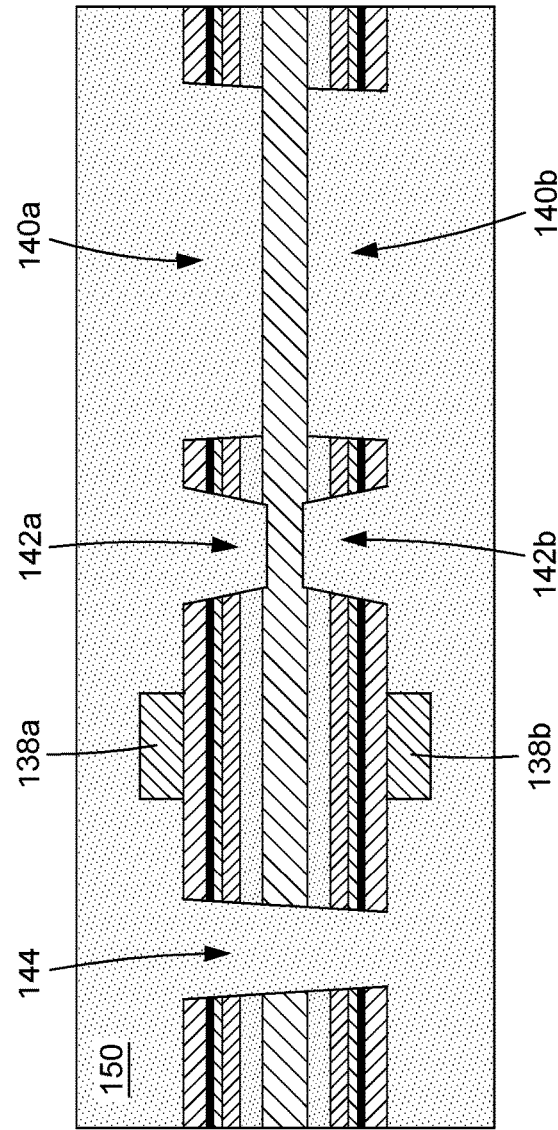
FIG. 3 is a cross-sectional view of another processing stage in manufacturing the package substrate.

At the processing stage shown in FIG. 2, the disclosed method of manufacturing the package substrate 100 may begin with exposing a portion of the conductive substrate 131. In particular, the conductive substrate 131 may be exposed to produce inductor cavities 140a, 140b as well as capacitor vias 142a, 142b for exposing the solid metal portion 132 of the conductive substrate 131 serving as the anode of the capacitor 130. One or more through via cavities 144 may also be formed at this stage. The method may continue with filling the exposed portion of the conductive substrate 131 (e.g., any or all of the cavities 140a, 140b, 142a, 142b, 144) with insulating material 150 as shown in FIG. 3, which may be a thermosetting film such as an Ajinomoto Build-up Film (ABF). The insulating material 150 may completely surround the conductive substrate 131 as well as all of the layers of the capacitor 130.

Figure 6:
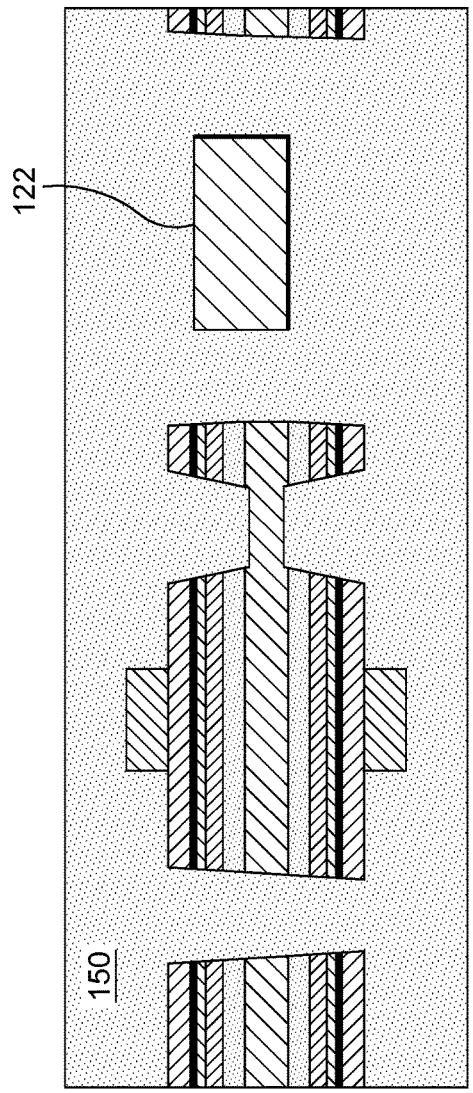
FIG. 6 is a cross-sectional view of another processing stage in manufacturing the package substrate.

Referring to FIG. 4, the method may continue with removing a portion of the insulating material 150 to re-expose a portion of the conductive substrate 131. In particular, the conductive substrate 131 may be re-exposed in the area of the inductor cavity 140a on the front side of the conductive substrate 131 to produce a cavity 160. The re-exposed portion of the conductive substrate 131 may then be removed (e.g., by plasma etching) as shown in FIG. 5 so that the cavity 160 is surrounded by the insulating material 150, and the magnetic core 122 may be provided within the cavity 160. As shown in FIG. 6, the cavity 160 may then be filled with insulating material, such as the same insulating material 150, such that the magnetic core 122 may be completely surrounded by the insulating material 150. Any undercut that may be created on the edges of the cavity 160 as the conductive substrate 131 is removed on either side of the cavity 160 may be filled by the insulating material 150.

Figure 7:
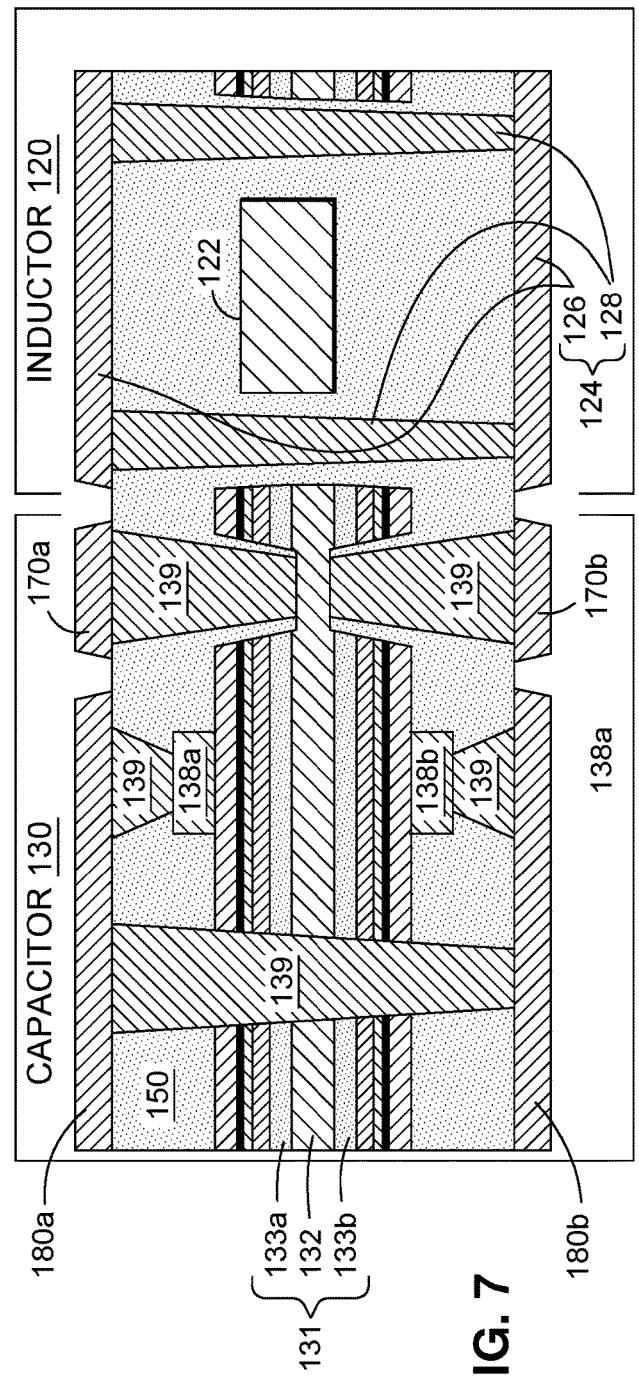
FIG. 7 is a cross-sectional view of another processing stage in manufacturing the package substrate.
Figure 8:
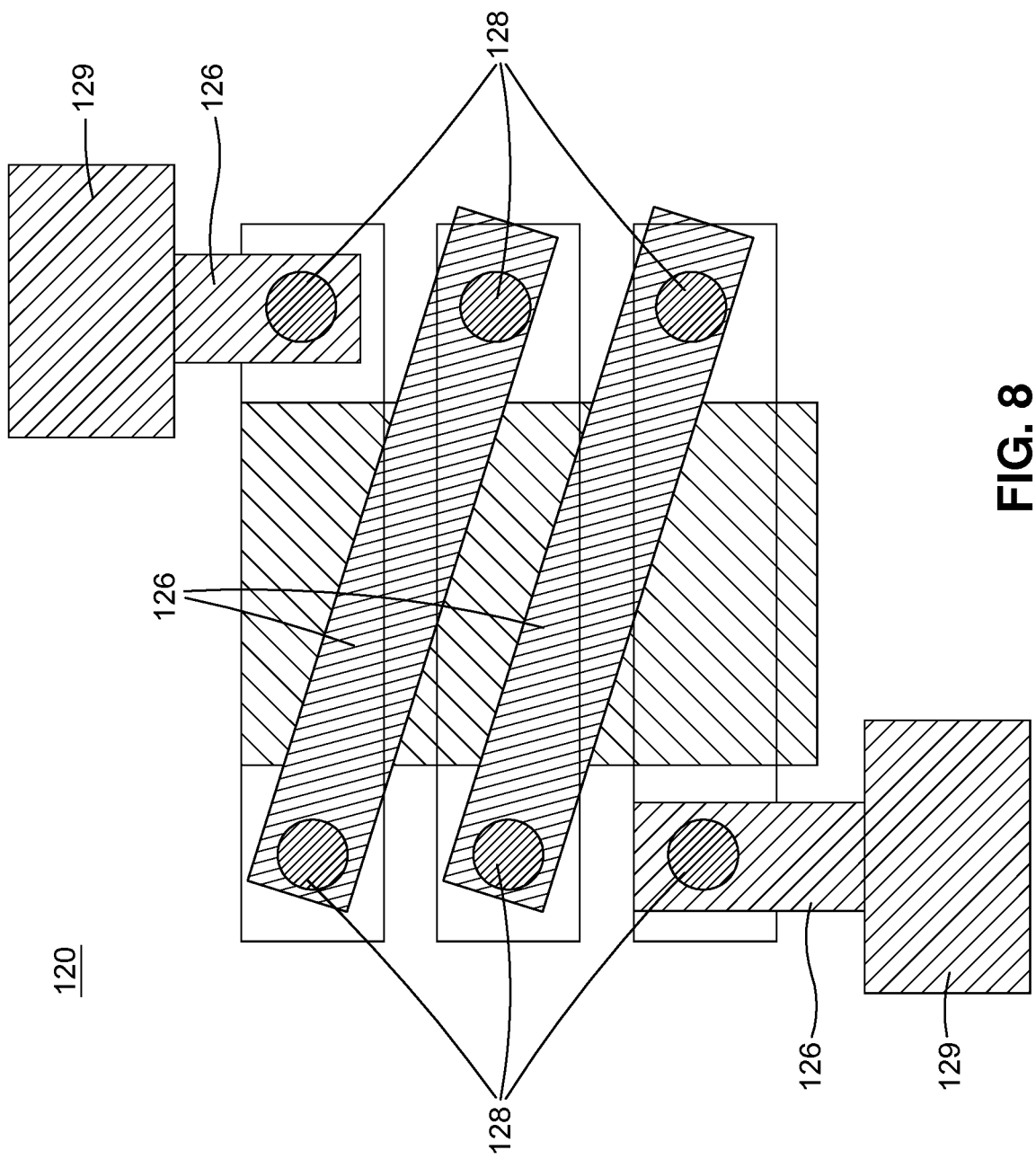
FIG. 8 is a top view of an inductor embedded in the package substrate.

Lastly, as shown in FIG. 7, the inductor 120 may be completed by forming the conductive winding 124 so as to surround the magnetic core 122. FIG. 8 is a top view of the inductor 120. As noted above, the conductive winding 124 may include one or more first segments 126 (e.g., top windings) defined by metal patterning outside the insulating material 150 and one or more second segments 128 (e.g., lateral windings) defined by conductive via(s) extending through the insulating material 150. As shown in FIG. 8, the metal patterning may further define a pair of inductor terminals 129 electrically connected to the conductive winding 124. The via(s) defining the second segment(s) may be formed by removing a portion of the insulating material 150 and filling with a conductive via fill. In the same way, vias 139 may be formed in each of the cavities 142a, 142b, 144 as well as to the conductive pads 138a, 138b in order to make the anode, cathode, and passthrough connections of the capacitor 130. In addition to defining the first segment(s) 126 of the conductive winding 124 of the inductor 120, the metal patterning may further define terminals 170a, 170b, 180a, 180b for the capacitor 130, with terminals 170a, 170b being electrically connected (by vias 189) to the solid metal portion 132 of the conductive substrate 131 serving as the anode of the capacitor 130 and terminals 180a, 180b being electrically connected (by vias 189 and conductive pads 189) to the conductive polymer layer 135a, 135b serving as the cathode of the capacitor 130, as well as in some cases to each other by a passthrough via 189 as shown.

Figure 9:
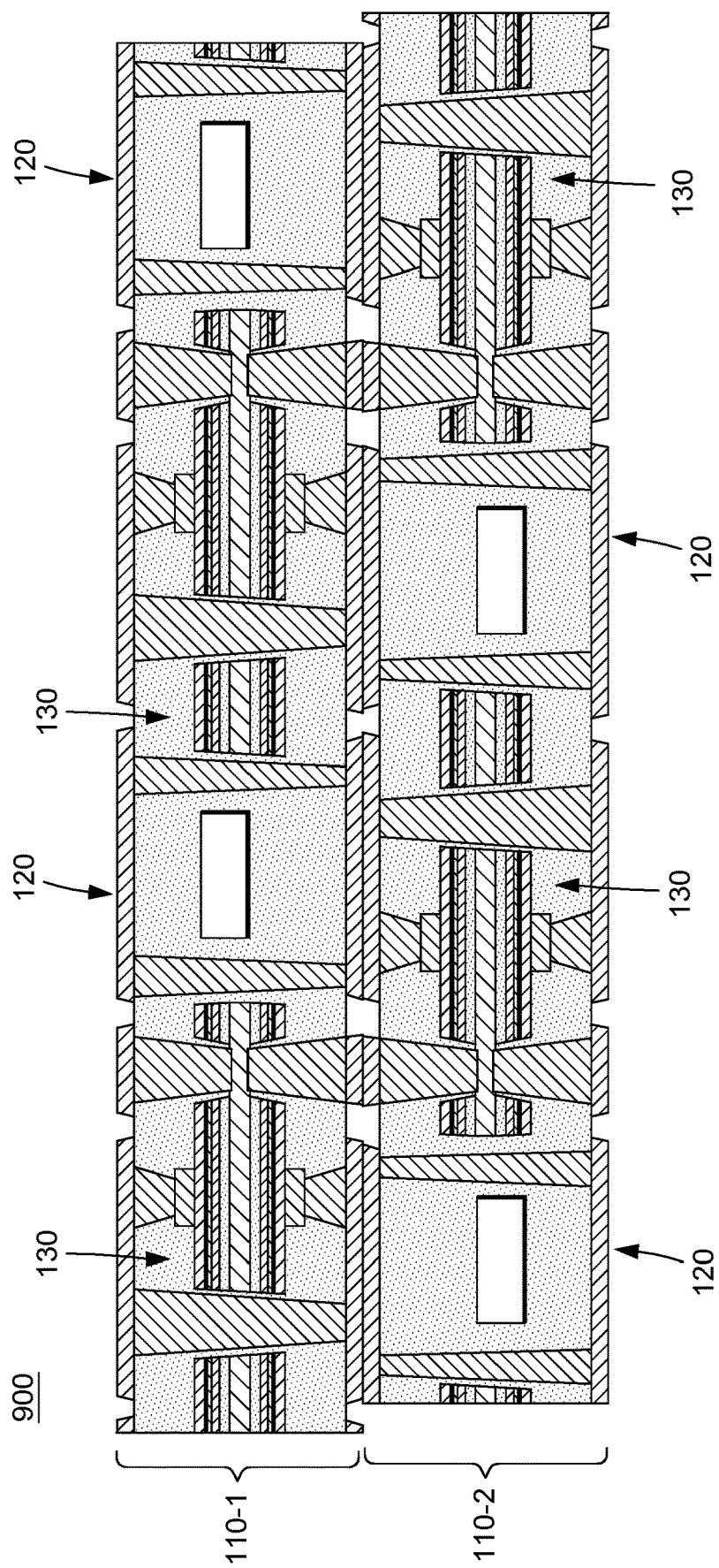
FIG. 9 is a cross-sectional view of a package substrate including two stacked substrate cores.

FIG. 9 is a cross-sectional view of a package substrate 900 including two stacked substrate cores 110-1, 110-2. Like the package substrate 100 described above, the package substrate 900 may be used to package ICs to produce a packaged semiconductor device and may, advantageously include one or more inductors 120 and/or one or more capacitors 130 embedded in one or both of the substrate cores 110-1, 110-2 thereof. As shown, the first and second substrate cores 110-1, 110-2 may be vertically stacked such that a capacitor 130 embedded in the second substrate core 110-2 is in vertical alignment with an inductor 120 embedded in the first substrate core 110-1.

Figure 10:
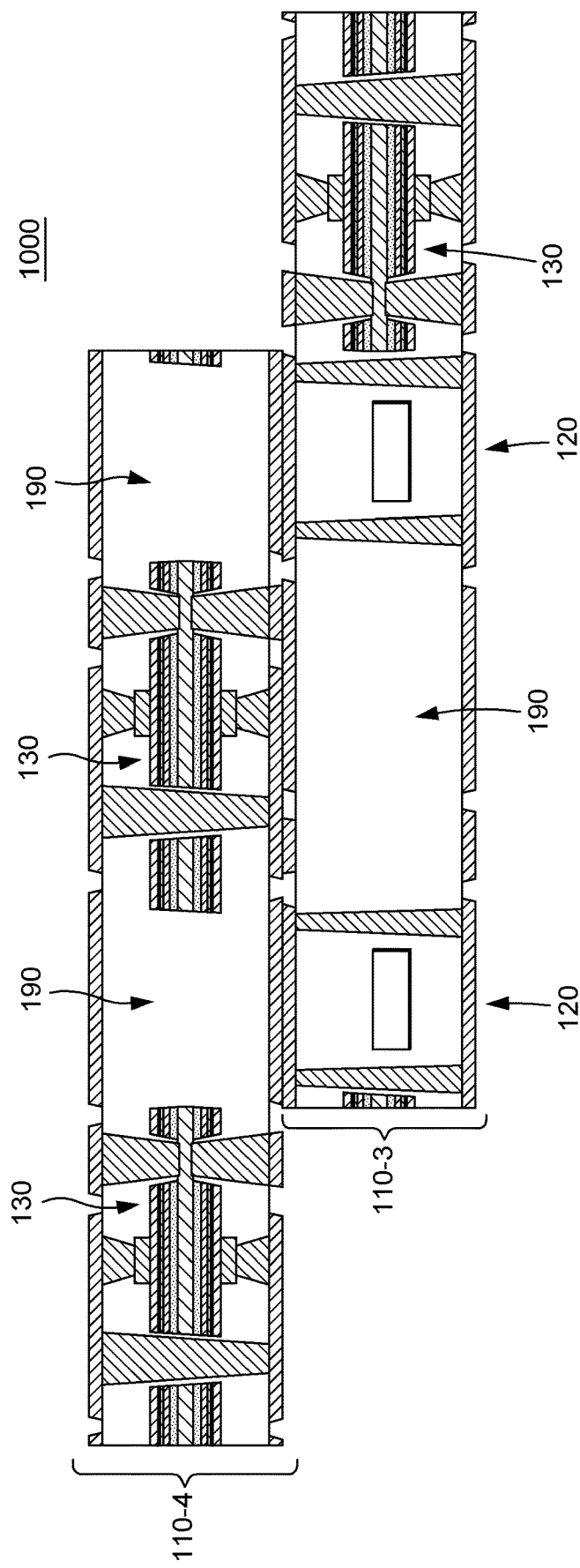
FIG. 10 is a cross-sectional view of another package substrate including two stacked substrate cores.

FIG. 10 is a cross-sectional view of another package substrate 1000 including two stacked substrate cores 110-3, 110-4. Like the package substrate 100 and the package substrate 900 described above, the package substrate 1000 may be used to package ICs to produce a packaged semiconductor device and may, advantageously include one or more inductors 120 and/or one or more capacitors 130 embedded in one or both of the substrate cores 110-3, 110-4 thereof. As shown, the first and second substrate cores 110-3, 110-4 may be vertically stacked in a staggered arrangement such that a capacitor 130 embedded in the second substrate core 110-4 is in vertical alignment with a redistribution layer (RDL) 190 of the first substrate core 110-3. Alternatively, or additionally, a redistribution layer (RDL) 190 of the second substrate core 110-4 may be in vertical alignment with an inductor 120 embedded in the first substrate core 110-3.

In order to manufacture package substrates 900, 1000 including stacked substrate cores 110-1, 110-2, 110-3, 110-4 as described herein, the substrate cores 110 may first be individually produced with inductors 120 and/or capacitors 130 embedded therein, and including RDL 190 and other features as desired. The individual substrate cores 110 may then be stacked and bonded together, either directly by metal sintering the metal patterning layers as shown or using an intervening conductive paste or solder.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A package substrate for a semiconductor device, the package substrate comprising:
   a first substrate core;
   an inductor embedded in the first substrate core, the inductor including a magnetic core embedded in the first substrate core and a conductive winding surrounding the magnetic core, the conductive winding including one or more first segments defined by metal patterning on the first substrate core and one or more second segments defined by one or more conductive vias extending through the first substrate core;
   a second substrate core vertically stacked with the first substrate core; and
   a capacitor embedded in the second substrate core in vertical alignment with the inductor embedded in the first substrate core.

2. The package substrate of claim 1, further comprising a capacitor embedded in the first substrate core.

3. The package substrate of claim 2, wherein the inductor and the capacitor embedded in the first substrate core define a voltage regulator arranged to step down a voltage output by an integrated circuit to be mounted on the package substrate.

4. The package substrate of claim 3, wherein the voltage regulator comprises a buck converter.

5. The package substrate of claim 1, wherein the inductor and the capacitor embedded in the second substrate core define a voltage regulator arranged to step down a voltage output by an integrated circuit to be mounted on the package substrate.

6. The package substrate of claim 5, wherein the voltage regulator comprises a buck converter.

7. The package substrate of claim 1, further comprising a capacitor embedded in the first substrate core, the capacitor including a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer.

8. The package substrate of claim 1, wherein the capacitor includes a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer.

9. A packaged semiconductor device comprising:
   an integrated circuit; and
   a package substrate on which the integrated circuit is mounted, the package substrate comprising:
   a first substrate core;
   an inductor embedded in the first substrate core, the inductor including a magnetic core embedded in the first substrate core and a conductive winding surrounding the magnetic core, the conductive winding including one or more first segments defined by metal patterning on the first substrate core;
   a second substrate core vertically stacked with the first substrate core; and
   a capacitor embedded in the second substrate core in vertical alignment with the inductor embedded in the first substrate core.

10. The packaged semiconductor device of claim 9, wherein the package substrate further comprises a capacitor embedded in the first substrate core.

11. The packaged semiconductor device of claim 9, wherein the inductor and the capacitor define a voltage regulator arranged to step down a voltage output by the integrated circuit.

12. The packaged semiconductor device of claim 11, wherein the voltage regulator comprises a buck converter.

13. The packaged semiconductor device of claim 9, further comprising a capacitor embedded in the first substrate core, the capacitor including a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer.

14. The packaged semiconductor device of claim 9, wherein the capacitor includes a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer.

15. A package substrate for a semiconductor device, the package substrate comprising:
a first substrate core;
an inductor embedded in the first substrate core, the inductor including a magnetic core embedded in the first substrate core, an insulating material surrounding the magnetic core, and a conductive winding surrounding the magnetic core and including one or more first segments defined by metal patterning outside the insulating material;
a second substrate core vertically stacked with the first substrate core; and
a capacitor embedded in the second substrate core in vertical alignment with the inductor embedded in the first substrate core.

16. The package substrate of claim 15, wherein the conductive winding further includes one or more second segments defined by conductive vias extending through the insulating material.

17. The package substrate of claim 15, wherein the inductor and the capacitor define a voltage regulator arranged to step down a voltage output by an integrated circuit to be mounted on the package substrate.

18. The package substrate of claim 17, wherein the voltage regulator comprises a buck converter.

19. The package substrate of claim 15, further comprising a capacitor embedded in the first substrate core, the capacitor including a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer.

20. The package substrate of claim 15, wherein the capacitor includes a conductive substrate having a front side and a back side, a front dielectric layer on the front side of the conductive substrate, a back dielectric layer on the back side of the conductive substrate, a front conductive polymer layer on the front dielectric layer, and a back conductive polymer layer on the back dielectric layer.

* * * * *

UNITED STATES PATENT AND TRADEMARK OFFICE
CERTIFICATE OF CORRECTION

| | | |
|---|---|---|
| PATENT NO. | : 12,183,692 B1 | Page 1 of 1 |
| APPLICATION NO. | : 18/404535 | |
| DATED | : December 31, 2024 | |
| INVENTOR(S) | : Carlos Andres Riera Cercado et al. | |

It is certified that error appears in the above-identified patent and that said Letters Patent is hereby corrected as shown below:

On the Title Page

Item (12) delete "Riera" and insert -- Cercado et al. --.

Item (72) the first Inventor reading "Carlos Riera" should be amended to read "Carlos Andres Riera Cercado".

Signed and Sealed this
Twenty-ninth Day of April, 2025

Coke Morgan Stewart
*Acting Director of the United States Patent and Trademark Office*